United States Patent [19]
Philipossian

[11] Patent Number: 5,420,065
[45] Date of Patent: May 30, 1995

[54] PROCESS FOR FILLING AN ISOLATION TRENCH

[75] Inventor: Ara Philipossian, Redwood Shores, Calif.

[73] Assignee: Digital Equipment Corporation, Maynard, Mass.

[21] Appl. No.: 69,923

[22] Filed: May 28, 1993

[51] Int. Cl.⁶ .......................................... H01L 21/302
[52] U.S. Cl. ...................... 437/67; 437/228; 437/238
[58] Field of Search ................... 437/67, 228, 238

[56] References Cited

U.S. PATENT DOCUMENTS

| | | | |
|---|---|---|---|
| 4,980,311 | 12/1990 | Namose | 437/67 |
| 5,173,436 | 12/1992 | Gill et al. | 437/67 |
| 5,173,439 | 12/1992 | Dash et al. | 437/67 |
| 5,175,123 | 12/1992 | Vasquez et al. | 437/67 |
| 5,182,221 | 1/1993 | Sato | 437/67 |
| 5,262,002 | 11/1993 | Grewel et al. | 437/67 |

OTHER PUBLICATIONS

Wolf et al., "Silicon Processing for the VLSI Era, Vol. I", pp. 183–187, 1986.

Primary Examiner—Olik Chaudhuri
Assistant Examiner—Richard A. Booth
Attorney, Agent, or Firm—Denis G. Maloney; Art Fisher

[57] ABSTRACT

A process for filling an isolation trench with a dielectric is described. The deposition pressure of a gas from which a silicon dioxide dielectric is deposited in a trench is changed on a real-time basis during such deposition. Such pressure gradually increases from about 20 mTORR to 900 mTORR. The result is that particle generation during the initial stages of the deposition is maintained at a low rate, while the high pressure needed to provide deposition in a trench as it is filled is provided.

3 Claims, 1 Drawing Sheet

PROCESS FOR FILLING AN ISOLATION TRENCH

BACKGROUND OF THE INVENTION

The present invention relates to the fabrication of integrated circuitry and, more particularly, to forming a layer of material within and about a cavity in a surface of a substrate.

There generally are many steps associated with fabricating integrated circuitry. Some of these steps require forming a layer of material within and about a cavity in a surface of a substrate. In this connection, it is not unusual in very large scale integration to provide isolation trenches between areas of a substrate on which differing parts of an integrated circuit are to be formed. Such trenches physically and electrically isolate the areas. In general, each isolation trench includes not only a physical trench-like cavity within the substrate, but also a filling within the cavity of an insulating material, such as a silicon dioxide. The trench is filled with the insulating material by forming a layer of the same on the substrate surface within and about the same. One way of forming the layer is to deposit the material in a deposition chamber from a gas which contains constituents of the desired insulating material. For example, if the insulating material is silicon dioxide, it can be deposited by low pressure chemical vapor deposition of silicon and oxygen species from tetraethoxysilane (TEOS).

The conventional practice is to maintain the gas from which the insulating material deposits at a generally constant pressure within the deposition chamber. As discussed below, this is a relatively high pressure in view of the necessity of being reasonably sure that the trench fills even though the configuration of the same, i.e., the ratio of the depth of the trench to its width (its minimum opening width) changes during the formation of the filling layer. This ratio is typically referred to as the aspect ratio. That is, as also discussed below, it will be seen that as the deposition progresses, this aspect ratio changes dramatically—as the layer is formed, the width of the opening narrows dramatically relative to the depth of the trench. That is, in order to effectively fill the trench, molecules have to be able to penetrate the trench and make their way to the bottom without incurring heavy losses due to reactions with the side walls.

While increase in pressure has a beneficial effect on trench filling capacity in view of this problem, it has the unfortunate adverse effect of particle generation. That is, as pressure increases more particles are generated due to an increase in gas-phase reaction rates.

SUMMARY OF THE INVENTION

The present invention provides a process of forming a layer of material within a trench or other cavity that circumvents the above problem. When the layer is a deposited one of silicon dioxide as aforesaid, the method includes increasing the processing pressure during the deposition itself, i.e., in real-time. That is, a "ramped-pressure" process is used during the oxide deposition interval. The deposition begins at a base pressure and ends at a significantly higher pressure. However, the average number of particles which are generated by the sequential differing pressure steps is lower than the number of particles which would be generated if the original processing step at a relatively constant pressure was implemented.

While the invention is particularly applicable to taking into consideration the configurational changes in an isolation trench in real-time when a layer of silicon dioxide is deposited from tetraethoxysilane, it broadly includes the concept of changing the value of a processing characteristic (which characteristic may be a parameter such as pressure or temperature when the step is a deposition step) in the formation of integrated circuitry, in light of configurational or other structural changes caused by that very same processing step.

Other features and advantages of the invention either will become apparent or will be described in connection with the following, more detailed description of a preferred embodiment of the invention.

BRIEF DESCRIPTION OF THE DRAWING

With reference to the accompanying drawing.

DETAILED DESCRIPTION OF THE PREFERRED EMBODIMENT(S)

The following relatively detailed description is provided to satisfy the patent statutes. However, it will be appreciated by those skilled in the art that various changes and modifications can be made without departing from the invention.

Figure 1:
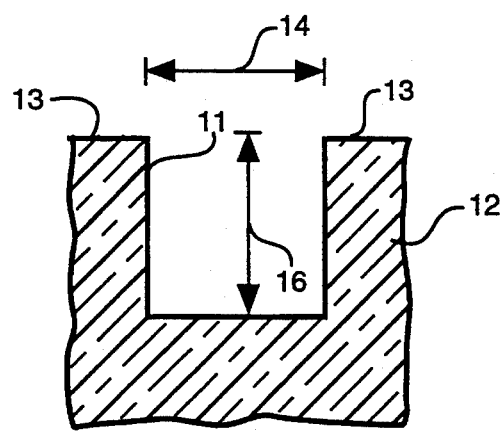
FIG. 1 is a highly enlarged and schematic sectional view of a trench within a substrate to be filled with an insulating material to become an isolation trench.

Reference is made to the figures for a discussion of the problem. With reference to FIG. 1, as mentioned previously a cavity in the form of shallow trench 11 is provided within a substrate 12 (in this case an epitaxial layer on a single crystal wafer—not shown) between regions 13 on the substrate at which circuit devices are to be produced.

Figure 2:
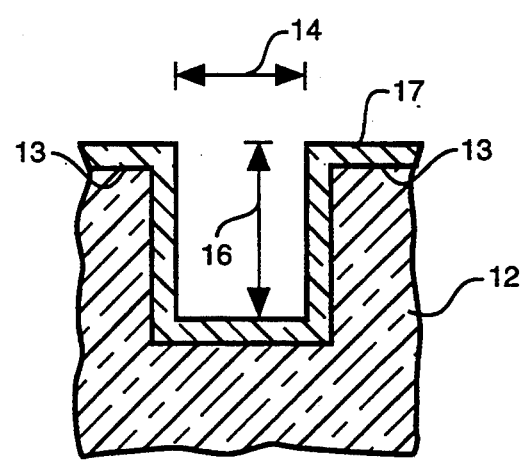
FIGS. 2, 3 and 4 are sequential views illustrating configurational changes during the deposition of a layer of insulating material or the like within the trench.
Figure 3:
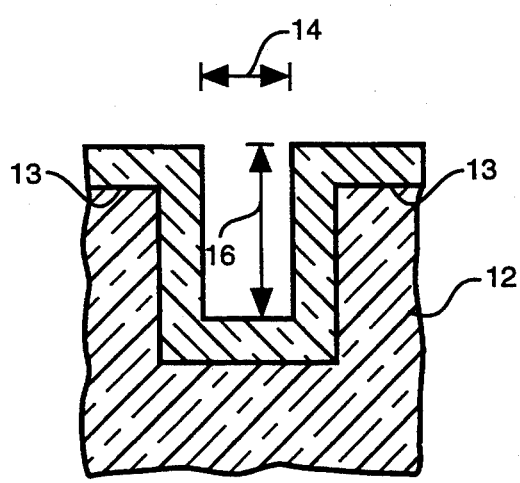
Figure 4:
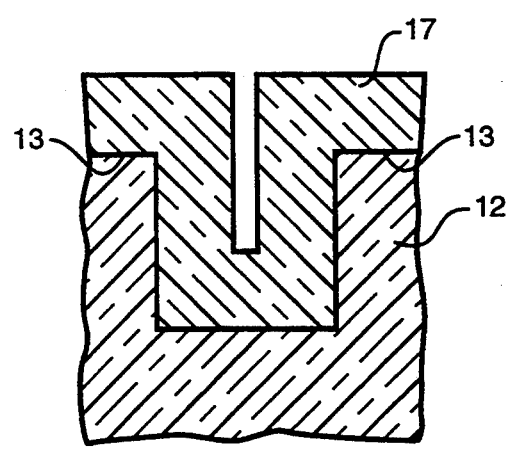

Trench 11 has an aspect ratio, i.e., the ratio of its minimum opening represented by dimensional arrow 14 to the depth of the trench represented by dimensional arrow 16 is referred to as its aspect ratio. If the trench is both 1 $\mu$m wide and 1 $\mu$m deep, this aspect ratio is 1. It changes, though, as the trench is filled. It is typical to fill such a trench with silicon dioxide or other insulating material to make the same effective as an electrical isolation trench. A silicon dioxide layer 17 formed in a deposition chamber by chemical vapor deposition is illustrated in FIGS. 2 through 4, such figures showing the progression during such deposition. FIG. 2 illustrates the initial stages of the formation of such layer 17. As is illustrated, the aspect ratio discussed previously increases slightly. As the deposition progresses the aspect ratio increases even more dramatically. In this connection, as will be recognized on an inspection of FIG. 3, the width of the trench decreases significantly while the effective depth remains the same. The layer which is deposited builds up on the opposed sides of the trench, whereas the thickness of the layer added at the bottom of the trench is counteracted by the thickness of the layer added to the substrate surfaces adjacent the original trench. With reference to FIG. 4, it will be seen that as the deposition progresses the aspect ratio approaches infinity. It should be noted that the drawings show an idealized case. It is not unusual for the trench opening to be completely closed before complete trench filling and voids to be formed along the trench.

In view of the above phenomenon, it is common when silicon dioxide or the like is to be deposited, that it be done at a relatively high pressure. For example, when the deposition gas is tetraethoxysilane, a deposition pressure in the order of 600 mTORR with the substrate being maintained at a constant temperature of 700° C., is typical. Even with such relatively high pressure, it takes almost an hour to fill a 1 μm by 1 μm trench.

The mean-free-path of the molecules which form the layer 17 is roughly 600 μm in such a situation. It can be seen, though, as the deposition progresses it is more difficult for the molecules to penetrate the trench and make their way to the bottom without incurring heavy losses due to reactions with the side walls. With a mean-free-path of 600 μm, this is generally an impossible task for the molecules as the trench becomes filled. This is in spite of the fact that relatively high pressure is utilized for the deposition. In this connection, it must be kept in mind that it is necessary to balance the beneficial effect of increasing pressure on trench filling capability against the unfortunate adverse effect of particle generation. That is, as the pressure is increased the rate of particles being formed is increased significantly due to an increase in gas-phase reaction rates. This results in increased defect density and, hence, a decrease in yield.

In keeping with the invention, the pressure at which the layer 17 is deposited is changed in real-time during such deposition in order to both provide the higher pressure needed near the end of the deposition and minimize the pressure and, hence, particle generation at other times. That is, in the specific implementation mentioned earlier the initial deposition of silicon dioxide from tetraethoxysilane is accomplished by beginning deposition with the gas within the deposition chamber at a pressure of about 20 mTORR and gradually increasing it to about 900 mTORR. Although the number of particles which are generated towards the end of the deposition cycle is significantly higher than the number desired, this increase is more than offset by the significantly lower number of particles which are generated during the initial stages of film deposition. Thus, the parameters of the processing step representing such deposition are tailored in view of changes in the surface configuration caused by the deposition itself. The deposition step is divided, in essence, into a plurality of sequential steps, each of which takes into consideration the structural changes made by the earlier steps. As used herein, the term "substrate" is meant to encompass not only the original structure on which integrated circuitry is formed but also the intermediate structures that are formed by subsequent processing and heating.

While the main driving force behind adopting the invention is to reduce the number of processing induced particles during filling of trenches in a typical shallow trench isolation process, it has many other advantages. The reduced particle generation will result in many systems incorporating the invention having longer operating times and mean times between failures. The specific invention if ramped up to even higher pressure has the potential to fill very aggressive geometries during the formation of integrated circuitry.

As mentioned at the beginning of the detailed description, Applicant is not limited to the specific embodiment(s) described above. Various changes and modifications can be made. For example, although in the preferred arrangement the pressure is gradually increased between a pair of limits, one or more step changes could be used in place of or in conjunction with the gradual changes. Moreover, although it is a processing parameter associated with the deposition, i.e., the pressure, which is changed, from the broad standpoint the invention is applicable to changing any processing characteristic, e.g., the constituents of a deposition gas, during a processing step in light of real time structural changes which are caused to occur during such step. Also, although the invention is particularly applicable to taking into consideration surface configurational changes which are caused by a processing step, from the broad standpoint the real-time tailoring provided by the invention is achievable with other types of structural changes that are made. The claims, their equivalents and their equivalent language define the scope of protection.

What is claimed is:

1. A process of depositing a layer of silicon dioxide within and about a trench in a surface of a substrate during the formation of integrated circuitry, comprising the steps of:
   (a) subjecting said surface to a gas having constituents of said silicon dioxide; and
   (b) increasing the pressure of the gas at said surface after deposition of said material on said surface has started, from a pressure of about 20 mTORR to about 900 mTORR while said surface is maintained at a constant temperature of about 700° C.

2. The process of claim 1 wherein said trench is an isolation trench between areas of said substrate for integrated circuitry, having a minimum opening width that is the width of said trench.

3. The process of claim 2 wherein said trench is a trench having a depth-to-minimum opening width ratio which changes as said layer is formed.

* * * * *